(12) United States Patent
DiVergilio et al.

(10) Patent No.: US 8,760,054 B2
(45) Date of Patent: Jun. 24, 2014

(54) MICROWAVE PLASMA ELECTRON FLOOD

(75) Inventors: William DiVergilio, Cambridge, MA (US); Bo Vanderberg, Gloucester, MA (US)

(73) Assignee: Axcelis Technologies Inc., Beverly, MA (US)

( * ) Notice: Subject to any disclaimer, the term of this patent is extended or adjusted under 35 U.S.C. 154(b) by 554 days.

(21) Appl. No.: 13/010,888

(22) Filed: Jan. 21, 2011

(65) Prior Publication Data
US 2012/0187842 A1   Jul. 26, 2012

(51) Int. Cl.
*H05H 1/46*   (2006.01)

(52) U.S. Cl.
USPC ............ 315/111.41; 315/111.21; 315/111.31; 315/111.71; 250/423 R; 250/424; 250/493.1; 250/494.1

(58) Field of Classification Search
USPC ........... 250/281, 396 ML, 396 R, 397, 423 R, 250/424, 493.1, 494.1; 315/111.31, 111.41, 315/111.71, 111.81, 111.91, 501–504, 507
See application file for complete search history.

(56) References Cited

U.S. PATENT DOCUMENTS

| | | | |
|---|---|---|---|
| 4,985,109 A * | 1/1991 | Otsubo et al. | 156/345.41 |
| 5,399,871 A | 3/1995 | Ito et al. | |
| 6,100,536 A | 8/2000 | Ito et al. | |
| 6,271,529 B1 * | 8/2001 | Farley et al. | 250/492.21 |
| 6,451,674 B1 * | 9/2002 | Niwayama et al. | 438/516 |
| 7,223,449 B2 * | 5/2007 | Hori et al. | 427/569 |
| 7,402,816 B2 * | 7/2008 | Renau et al. | 250/396 ML |
| 7,723,707 B2 * | 5/2010 | Benveniste et al. | 250/492.3 |
| 7,800,083 B2 | 9/2010 | Vanderberg et al. | |

OTHER PUBLICATIONS

Ito, et al., High Density Plasma Flood System for Wafer Charge Neutralisation. 5 Pages.

* cited by examiner

*Primary Examiner* — Douglas W Owens
*Assistant Examiner* — Thai Pham
(74) *Attorney, Agent, or Firm* — Eschweiler & Associates, LLC

(57) ABSTRACT

A method and apparatus is provided for generating a plasma electron flood using microwave radiation. In one embodiment, a microwave PEF apparatus is configured to generate a magnetic field that rapidly decays over a PEF cavity, resulting in a static magnetic field having a high magnetic field strength near one side (e.g., "bottom") of the PEF cavity and a low magnetic field strength (e.g., substantially zero) near the opposite side (e.g., "top") of the PEF comprising an elongated extraction slit. In one particular embodiment, the one or more permanent magnets are located at a position that is spatially opposed to the location of the elongated extraction slit to achieve the rapidly decaying magnetic field.

The magnetic field results in an electron cyclotron frequency in a region of the cavity equal to or approximately equal to a microwave radiation frequency so that plasma is generated to diffuse through the extraction apertures.

12 Claims, 7 Drawing Sheets

MICROWAVE PLASMA ELECTRON FLOOD

FIELD OF THE INVENTION

The present invention relates generally to ion implantation systems, and more specifically to a method and apparatus for producing a plasma electron flood.

BACKGROUND OF THE INVENTION

In the manufacture of semiconductor devices, ion implantation is often used to dope semiconductor workpieces (e.g., silicon wafers) with impurities. For example, ion implanters or ion implantation systems may treat a workpiece with an ion beam to produce n-type or p-type doped regions or to form passivation layers on the workpiece. When used for doping semiconductors, the ion implantation system may inject a selected ion species to produce a desired extrinsic material.

In general, in ion implantation systems, maintaining an ion beam having charge neutrality (e.g., forming an ion beam plasma having a substantially equal density of both positively charged and negatively charged particles) is important for producing a high quality ion implantation. Charge neutrality aids in producing uniformity of an ion beam by preventing beam blow up (e.g., the tendency of the like charged ions comprising a beam to repel each other, thereby causing the beam to diverge away from its intended path), which can cause beam current loss and non-uniformities. If these non-uniformities are not corrected the workpiece may be implanted non-uniformly and wafer yield (i.e. the ratio of wafer area implanted with desired properties to total wafer area) may suffer.

Also, during ion implantation of a semiconductor wafer charge may build up on electrodes insulated by a gate oxide from the bulk semiconductor. This effect, commonly referred to as charging, can be detrimental to the semiconductor circuit if the voltages of the insulated feature (e.g. the gate electrode) exceed the breakdown voltage of the insulator (e.g. the gate oxide) such that resultant damage to the gate oxide occurs. It can be appreciated that the charging rate and voltage increase with beam current, and that ion implantation with ever increasing beam currents represents an increasing processing challenge.

To counteract the beam blow up and the charging problems, charging of an ion beam can be compensated for by providing electric charge of the opposite sign to the beamline and/or workpiece to be implanted. For example, for a positive ion beam it is common practice to provide electrons in an amount equal to the amount of ions per unit time to the workpiece (i.e., to match the ion beam current with an equal electron current to the workpiece). This compensation is typically brought about by devices such as plasma electron floods (PEF) apparatus that are configured to generate electrons (e.g., via electron generating processes such as thermionic emission, secondary emission, or discharge) and direct the generated electrons to the beamline and/or workpiece. Therefore, a plasma electron flood apparatus is an important subsystem of ion implanters that provides neutralizing charged particles into a beamline comprising an ion beam to generate an ion beam having an overall charge neutrality.

SUMMARY OF THE INVENTION

The present invention is directed towards a method and apparatus for generating a plasma electron flood (PEF) using microwave radiation. In one embodiment, the apparatus comprises a microwave PEF apparatus having one or more permanent magnets configured to generate a magnetic field that rapidly decays over a cavity (e.g., PEF cavity), resulting in a static magnetic field having a high magnetic field strength (typically 2 kGauss-4 kGauss) near one side (e.g., the "bottom") of the cavity and a low magnetic field strength (e.g., a substantially zero magnetic field) near the opposite side (e.g., the "top") of the cavity, which comprises an extraction aperture (e.g., an elongated extraction slit) in direct communication with an ion beamline. In one particular embodiment, the one or more permanent magnets are located at a position (e.g., at the "bottom" of the PEF cavity) that is spatially opposed to the location of the extraction aperture to achieve the rapidly decaying magnetic field. The magnetic field results in an electron cyclotron frequency in a region of the cavity that is equal to or approximately equal to a microwave radiation frequency so that a plasma is generated to diffuse through the extraction aperture.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
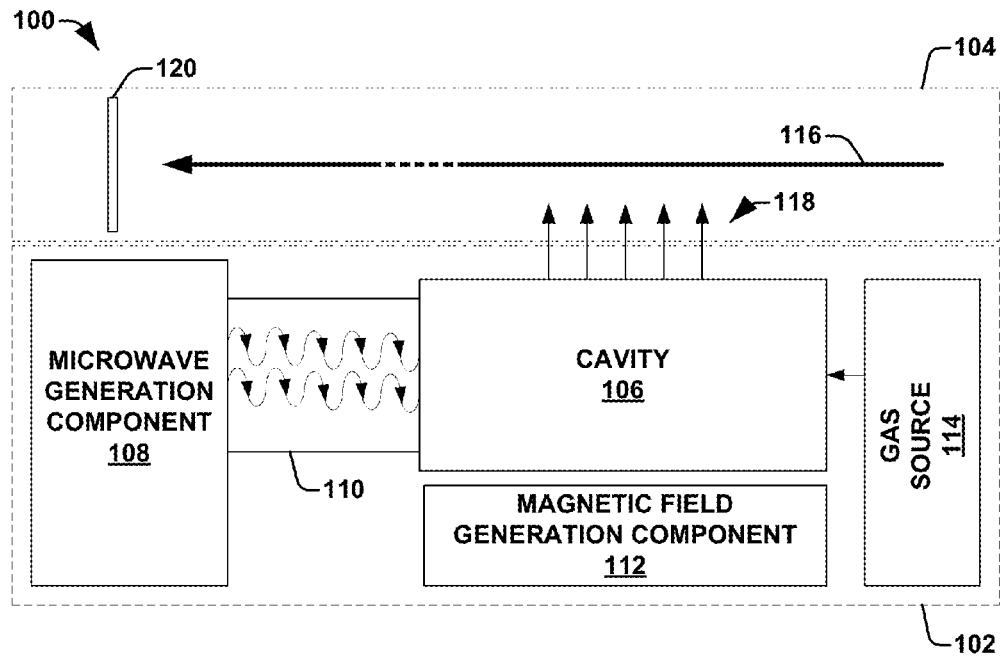
FIG. 1 illustrates a block diagram of an ion implantation system comprising a microwave plasma electron flood (PEF) system.

The present invention will now be described with reference to the drawings wherein like reference numerals are used to refer to like elements throughout.

The electron flood apparatus is an important subsystem of ion implanters. The electron flood apparatus provides neutralizing charged particles into a beamline comprising an ion beam to generate an ion beam having an overall charge neutrality. Charge neutrality allows for reduction of costs associated with integrated chip fabrication by improving the uniformity of ion beam implantation over a wafer and by avoiding damage due to the charging of insulated wafer components.

Generally, a plasma electron flood apparatus have generated a plasma, comprising a DC discharge that is produced from a hot cathode that emits electrons to ionize neutral gas atoms introduced into a PEF. However, due to cathode life limitations, periodic maintenance is required, increasing operational costs and ion implanter down time. Furthermore, the cathodes and other PEF parts are typically a source of wafer contaminants, in particular refractory metals such as Tungsten, Tantalum, and Molybdenum.

Therefore, forming a plasma electron flood (PEF) based upon a plasma generation by Electron Cyclotron Resonance (ECR) (i.e., absorption of microwave power by the plasma in regions where the electron cyclotron frequency of the local magnetic field matches the microwave frequency) is an attractive alternative to traditional cathode based PEFs. Such a microwave PEF allows for the generation of a high density plasma without periodic maintenance that is generally associated with a cathode based plasma generation. The microwave PEF may also run at low background pressures and produce a plasma that is free of harmful contaminants (e.g., refractory metals).

Plasma generation by ECR is well established. Early ECR plasma generation was performed using a magnetic mirror geometry, where the magnetic field was produced by a pair of current carrying coils (electromagnets), or using substantially uniform magnetic field geometries such as solenoids and magnetic mirrors, realized by either conventional or superconducting electromagnets. These techniques were later adapted for use in materials processing such as deposition and semiconductor wafer etching.

Alternatively, ECR plasma development used for ion beam space propulsion applications generated ECR plasmas in magnetic fields generated by permanent magnets. From their inception, such ECR systems utilized multicusp magnetic field configurations, wherein an array of alternating polarity permanent magnets line the walls of the ion source except for the region where the ion beam is extracted. The ion source chamber is usually cylindrical, about 35 cm in diameter and about 20 cm in length, with the ion extraction area at one end of the cylinder and about 30 cm in diameter. Typically about 12 or more magnetic line cusps comprise the permanent magnet circuit. This multicusp geometry has the desirable characteristics of producing a relatively large (>2 kG) magnetic field at the walls of the ion source for plasma confinement and a relatively small (<100 G) magnetic field in the extraction area.

This invention, though closely related to the technologies described above, employs a novel magnetic field geometry suited to the special requirements of an ECR plasma based electron flood for beam neutralization in an ion implanter. In one embodiment, a method and apparatus for forming a plasma electron flood (PEF) using a microwave based power source is provided herein for generating a magnetic field that rapidly decays over a cavity (e.g., PEF cavity), resulting in a static magnetic field having a high magnetic field strength (e.g., typically 2 kGauss-4 kGauss) near one side (e.g., the "bottom") of the cavity and a low magnetic field strength (e.g., a substantially zero magnetic field) near the opposite side (e.g., the "top") of the PEF comprising an extraction aperture (e.g., elongated extraction slit) in direct communication with an ion beamline. In one particular embodiment, the one or more permanent magnets are located in proximity to the cavity, for example, at a position (e.g., at the "bottom" of the cavity) that is spatially opposed to the location of the extraction aperture to achieve such a rapidly decaying magnetic field.

In one embodiment, the one or more permanent magnets extend along a length of the cavity. The magnetic field in a region or regions of the cavity is such that the local electron cyclotron frequency is substantially equal to the microwave frequency. As is well known to those skilled in the art, under these conditions electrons will strongly absorb the microwaves, accelerating the electrons to an energy that is sufficient to the ionize neutral atoms of the inert gas and form a plasma that may diffuse through the extraction aperture into the ion beamline.

FIG. 1 illustrates a block diagram of a first embodiment of an ion implantation system 100 having a microwave plasma electron flood (PEF) system 102, as provided herein. The microwave PEF system 102 is placed adjacent to a beamline 104 containing an ion beam 116 and is configured to generate a plasma comprising electrons and ions within a cavity 106 (e.g., a plasma electron flood (PEF) cavity) using a microwave plasma generation technique. The generated plasma 118 travels from the cavity 106 through an extraction slit into the beamline 104, thereby providing neutralizing ions to the ion beam 116 prior to the ion beam intersecting a workpiece 120 (e.g., located in a downstream target chamber).

More particularly, the microwave PEF system 102 comprises a microwave generation component 108 (i.e., microwave radiation source) configured to generate microwave radiation (e.g., electromagnetic radiation having a wavelength of 3 cm to 33 cm). The microwave generation component 108 is coupled to a microwave transmission line 110, which may be a waveguide or a co-axial line, that connects the microwave generation component 108 and the cavity 106 (e.g., by way of one or more apertures in the cavity 106, as shown below in FIG. 3). In various embodiments, the microwave generation component 108 may comprise a microwave power source (e.g., a magnetron or a solid-state microwave source) configured to provide a microwave radiation into the transmission line 110, which directs the microwave radiation into the cavity 106.

The cavity 106 may be configured to function as both a microwave cavity, substantially resonant at the frequency of the microwave radiation, and as a plasma electron flood (PEF) chamber. In one embodiment, the cavity 106 comprises a housing configured to contain a gas (e.g., Argon or Xenon). In one embodiment, the cavity 106 comprises a substantially empty housing containing no functional components used in the formation of a plasma (e.g., containing no components other than a gas and microwave radiation). The cavity 106 may be coupled to a gas source 114 by way of a gas input point (e.g., a valve) that provides the gas from a gas source 114 to the cavity 106. One or more extraction apertures (e.g., elongated extraction slits) extend along the cavity 106 (e.g., at the "top" of the cavity abutting the beamline 104) providing for direct communication between the cavity 106 and the process chamber 104.

A magnetic field generation component comprising one or more permanent magnets 112 is positioned in proximity of (e.g., located adjacent to) the cavity 106 and is configured to generate a magnetic field that extends into the cavity 106. The magnetic field comprises a static magnetic field that produces electron cyclotron resonance at an ECR heating frequency that is substantially equal to the frequency of the delivered microwave energy. For example, if the microwave radiation has a frequency of 2.45 GHz, then the magnetic field in a region of the cavity may have a field strength of 875 Gauss. Energy absorption by the plasma is then enhanced, allowing the use of a lower gas pressure (e.g., $2 \times 10^{-5}$ to $2 \times 10^{-4}$ Torr) in the cavity.

In one embodiment, the one or more permanent magnets 112 are configured to generate a magnetic field with sufficient amplitude (e.g., 2 kGauss) for plasma generation and that rapidly decays over the cavity, resulting in a static magnetic field having a high magnetic field strength near the "bottom" of the cavity and a low magnetic field strength (e.g., a substantially zero magnetic field) near the extraction aperture at the "top" of the cavity 106. In one particular embodiment, the one or more permanent magnets 112 are located at a position (e.g., at the "bottom" of the cavity) that is spatially opposed to the location of the extraction aperture to achieve such a rapidly decaying magnetic field.

During operation, the microwave generation component 108 generates microwave electromagnetic radiation and provides the microwave radiation to the cavity 106 via the transmission line 110. The microwave radiation comprises energy which is transferred to electrons in the cavity 106 that are resonating at an ECR heating frequency that is substantially equal to the frequency of the microwave radiation. The transferred energy increases the electron's energy to a value that is sufficient to ionize neutral atoms in the cavity resulting in a plasma. The plasma diffuses to fill the volume of the cavity 106 before diffusing through the extraction slit into the ion beamline 104. Since diffusion of the plasma is inversely proportional to the strength of the magnetic field (e.g., the stronger magnetic field, the less diffusion), the rapidly decaying magnetic field, having a minimal magnetic field strength in the vicinity of the extraction aperture (e.g., a substantially zero magnetic field), allows plasma to diffuse through the extraction aperture into the beamline 104.

Therefore, as provided herein, the microwave PEF system 102 comprises a cavity 106 having a strong magnetic field in areas of the PEF where a plasma is generated and a weak magnetic field (e.g., no magnetic field) in other areas of the cavity 106.

Figure 2:
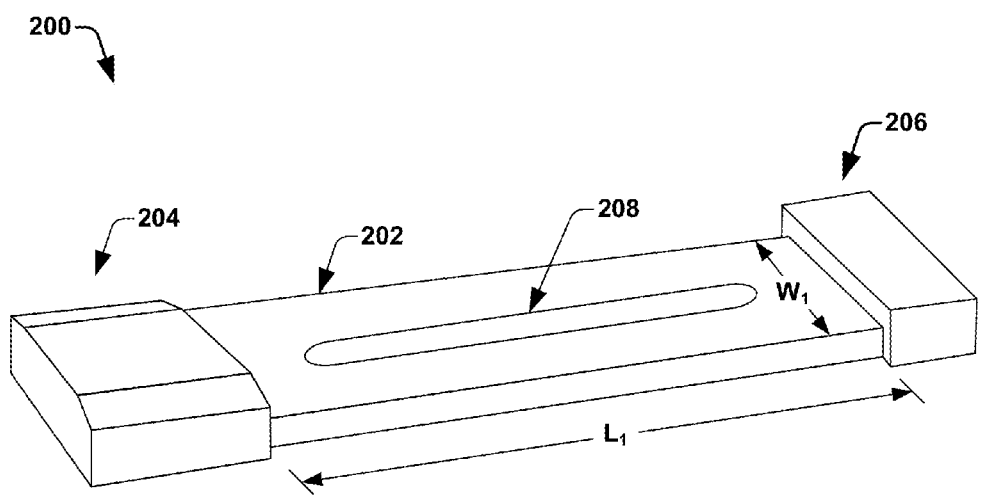
FIG. 2 illustrates a three dimensional illustration of a microwave PEF system.

FIG. 2 is a three-dimensional illustration of a microwave PEF system 200, comprising a PEF cavity 202, a microwave waveguide 204, and a gas source 206. In one embodiment, the PEF cavity 202 has a length $L_1$ of approximately 400 mm and a width $w_1$ of approximately 100 mm. An extraction aperture comprising an elongated extraction slit 208 extends along the PEF cavity 202 and is in direct communication with the process chamber. The elongated extraction slit 208 may have a width of approximately 1-10 mm and a length that varies from approximately 25-450 mm, for example.

The elongated extraction slit 208 may be formed within a slit plate, in one embodiment. In one embodiment, the elongated extraction slit 208 may have a length that is greater than or equal to the diameter of a workpiece to be implanted. This ensures uniformity of charge neutralization, allowing plasma to exit from the PEF cavity 202 along the elongated extraction slit 208. In addition, the length of the extraction slit $L_1$ can be made adjustable, based upon the size of a workpiece to be implanted, utilizing masking or other techniques that are well known by those of skill in the art, for example.

In one embodiment, the microwave waveguide 204 may comprise a fundamental mode waveguide. The fundamental mode waveguide may have maximum internal dimensions that are less than the wavelength of the microwave radiation. In one embodiment, the fundamental mode waveguide can be constructed of electrically conducting walls that propagate microwave energy. For example, in one exemplary embodiment the fundamental mode waveguide may be constructed of Aluminum. In an additional embodiment, the Aluminum waveguide may be Silicon clad.

Figure 3A:
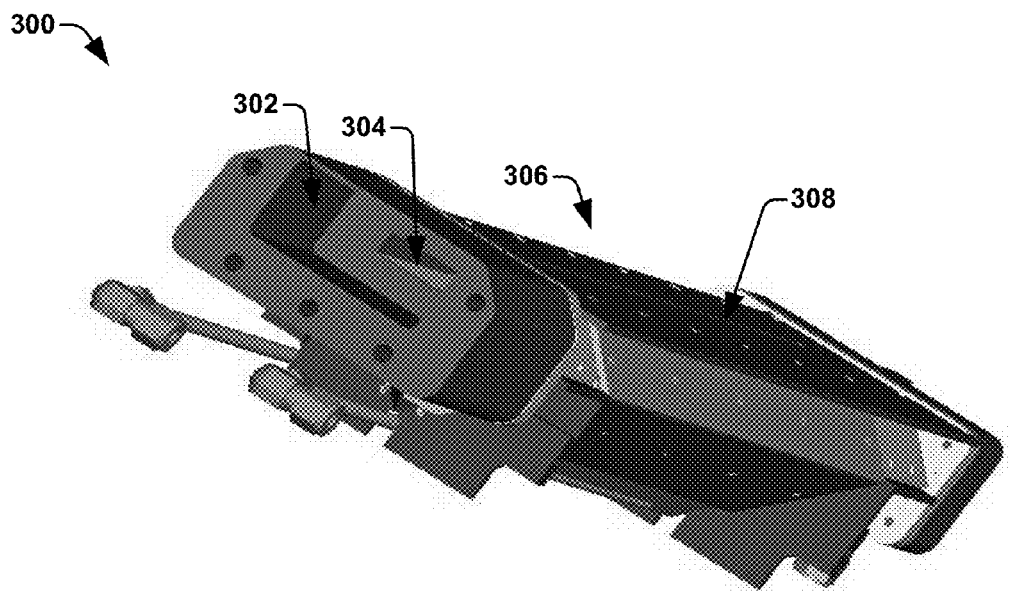
FIGS. 3a-3b show additional three dimensional illustrations of the microwave PEF system.
Figure 3B:
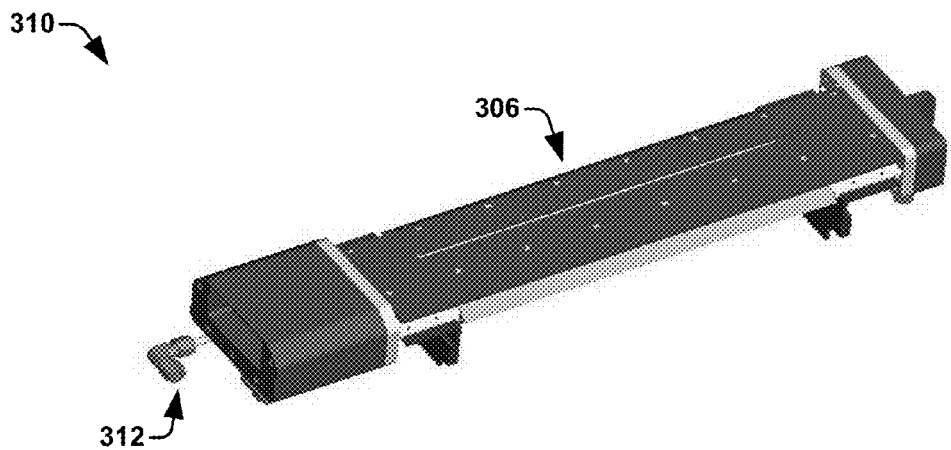

FIGS. 3a and 3b are additional three dimensional illustrations of the microwave PEF system provided herein, showing additional features.

FIG. 3a illustrates a first three-dimensional illustration 300 of the microwave PEF along its long axis. In particular, FIG. 3a illustrates a substantially rectangular waveguide 302 opening into an aperture 304 located at the end of the PEF cavity 306. It also illustrates a PEF cavity 306 having a five exterior walls configured into a five-sided diamond shape, wherein the elongated extraction slit 308 is formed within a slit plate configured on to the top wall of the PEF cavity 306.

FIG. 3b illustrates a second three-dimensional illustration 310 of the microwave PEF. As shown in FIG. 3b, in one embodiment the PEF cavity 306 may comprise a cooling mechanism. For example, as shown in FIG. 3b, a fitting 312 is configured to provide cooling water to the wall of the PEF cavity 306. The cooling mechanism keeps the temperature of the permanent magnets at an operating temperature that prevents thermal demagnetization of the permanent magnets.

Figure 4:
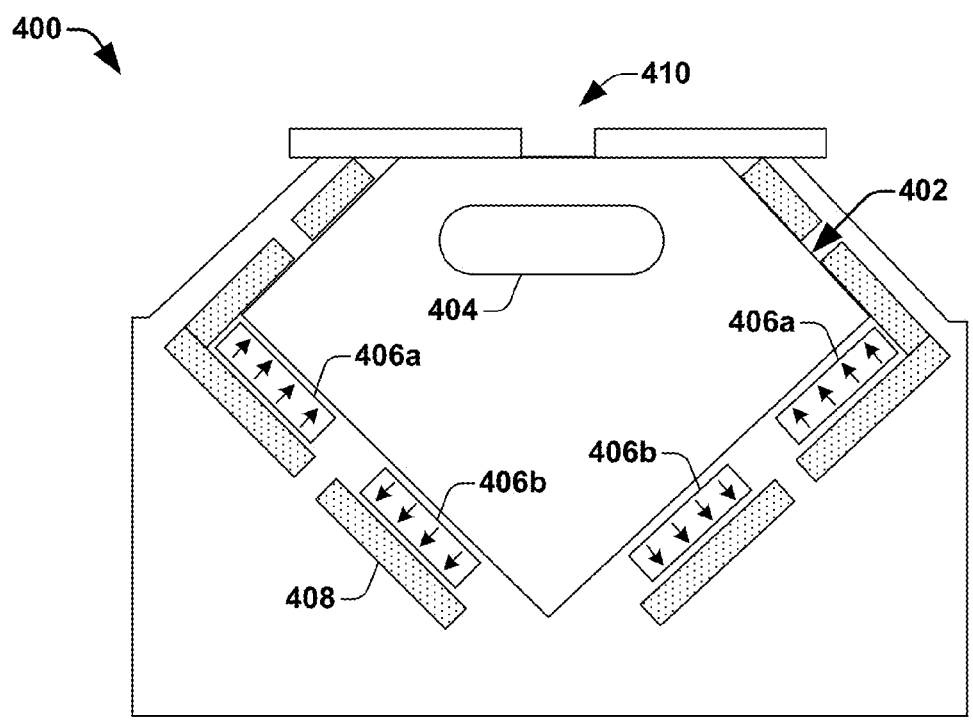
FIG. 4 illustrates a cross-sectional view of a microwave PEF system.

In one embodiment, the PEF cavity is configured to minimize microwave power dissipation (e.g., at the walls of the PEF cavity). Therefore, the PEF cavity may be constructed to have a high quality factor (e.g., Q factor is proportional to the maximum energy stored in the cavity to the average power loss in the cavity). This allows large electric fields to build up in the cavity even at low microwave powers and therefore permits ignition of a plasma even at very low gas pressures FIG. 4 illustrates a cross-sectional view of a microwave PEF system 400, as provided herein. In particular, FIG. 4 illustrates a cross sectional view of a cavity 402, oriented in the direction of the microwave waveguide (i.e., looking towards the microwave waveguide).

As shown in FIG. 4, the cavity 402 comprises a substantially empty housing having an aperture 404 is located at the end of the cavity 402. The aperture 404 allows microwave radiation, generated by a microwave generation component, to enter into the cavity 402 from a waveguide. In one embodiment, the cavity 402 contains no functional components used in the formation of a plasma. In one embodiment, the cavity 402 may comprise a housing that is configured to not contain refractory metals. In such an embodiment, the housing may be constructed of materials with little contamination risk to silicon workpieces, such as Aluminum or graphite, for example. The use of non-refractory metals in the housing allows for the plasma generated by the microwave PEF to be free of contaminants, in contrast to many existing PEF systems that rely upon the generation of plasma using refractory metal elements (e.g., anode, cathode, and repeller).

In one embodiment, magnets 406a and 406b are disposed along one or more lower walls of the PEF cavity spatially opposed to the extraction slit 410. In such an embodiment, the magnets 406a and 406b form regions within the cavity having a strong static magnetic field near the lower walls of the cavity 402. In these regions, electrons in a gas filling the cavity may undergo electron cyclotron resonance (ECR) motion. Electrons undergoing such ECR motion may absorb microwave radiation and based thereupon generate a plasma originating in ECR heating zones (i.e., zones having a strong magnetic field such that the local electron cyclotron frequency is substantially equal to the microwave frequency).

In one embodiment, the magnets 406a and 406b are configured to form a static magnetic field having a field strength that decreases across the cavity 402. In one particular embodiment, two magnets are configured along the exterior surface of each of the lower walls of the cavity, wherein a first magnet 406a is configured to have a first magnetic orientation and a second magnet is 406b configured to have a second magnetic orientation. The different orientations result in a single north magnetic pole cusp and a single south magnetic pole cusp running around the lower part of the cavity (e.g., see FIG. 5, supra). An exemplary magnet configuration showing magnetic orientations is shown in FIG. 4, wherein arrows inside of the magnets extend from a south pole to a north pole to show the direction of magnetization of the permanent magnets.

In various embodiments, the cavity 402 may be configured to comprise one or more elements of high permeability material configured to reduce the magnitude of the magnetic field, generated by the one or more permanent magnets, outside of the cavity. For example, in one embodiment, the PEF system 400 comprises one or more magnetic field shielding layers 408 configured to prevent/attenuate the propagation of magnetic fields generated by the magnets 406 into other parts of the processing chamber (e.g., the beamline) and/or to guide magnetic field within a PEF cavity. As shown in FIG. 4, magnetic field shielding layers 408 are configured along the outside edges of the cavity 402 to prevent propagation of the magnetic field outside of the PEF cavity 402. In one embodiment, the magnetic field shielding layers 408 may comprise steel plates.

The ion implantation process is typically performed in a high vacuum process chamber which prevents dispersion of the ion beam by collisions with residual gas molecules. The microwave PEF 400 provided herein allows for the generation of a high density plasma and that runs at low background pressures and is free of contaminants (e.g., refractory metals).

Figure 5:
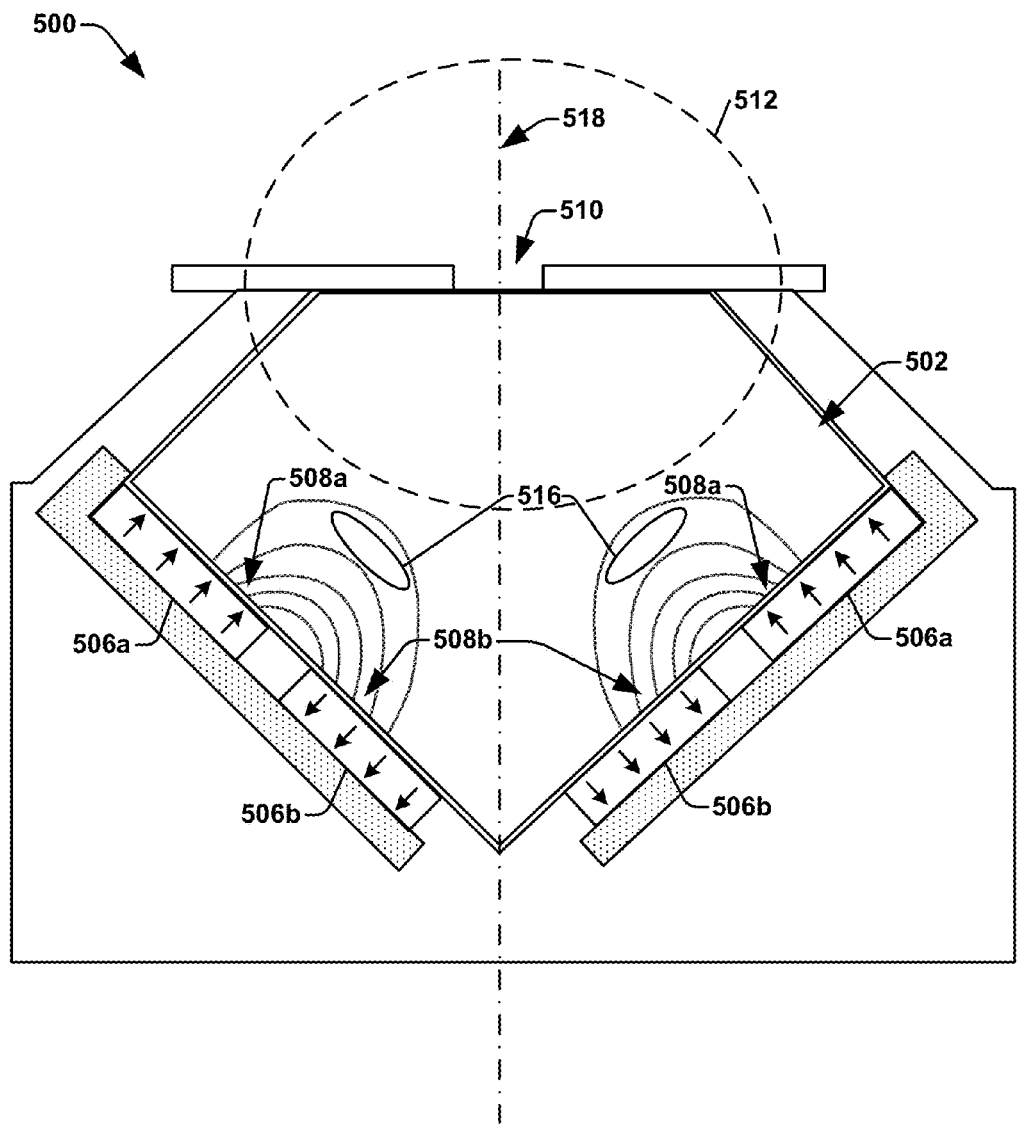
FIG. 5 illustrates a cross-sectional view of a microwave PEF system showing exemplary magnetic field lines of a magnetic field generated by magnets to extend into a cavity.

FIG. 5 illustrates a cross-sectional view of a plasma flood system 500 as provided herein showing exemplary magnetic field lines, in a PEF cavity 502, of a magnetic field generated by magnets 506a and 506b. In particular, the magnetic field lines are illustrated in the region where electrons are trapped by the magnetic field, accelerated by the microwaves, and produce plasma by ionizing neutral gas.

As shown in FIG. 5, the magnets 506a and 506b are located along the lower walls of the PEF cavity 502 to form a single north magnetic pole cusp region 508a and a single south magnetic pole cusp region 508b running around the lower portion of the PEF cavity (i.e., extending along the perimeter of the PEF cavity). Electrons travel in circular orbits about magnetic field lines, with the frequency of the orbit (electron cyclotron frequency) proportional to the magnetic field strength. The center of the circular orbit moves along a magnetic field line, so that the total electron trajectory is helical. As an electron moves from a lower magnetic field region near the center of the cavity toward a higher magnetic field region (e.g., the cusp regions 508a and 508b) the electron will be reflected by the magnetic mirror effect and returned to the lower magnetic field region, thus trapping electrons in the region illustrated by the magnetic field lines. Electrons which pass through ECR heating zones 516, where the local electron cyclotron frequency is substantially equal to the microwave frequency, will be accelerated by the electric field of the microwave radiation filling the cavity, thereby causing the electrons to reach energies sufficient to ionize neutral atoms.

Referring again to FIG. 5, the magnets 506a and 506b are symmetric with respect to a plane of symmetry 518 running along the length of the extraction aperture 510 (e.g., elongated extraction slit). The symmetry of the magnets causes the magnetic field contributions from each magnet to cancel each other out along the plane of symmetry 518 so that there is a minimal magnetic field (e.g., no magnetic field) in the vicinity of the extraction aperture 510. Therefore, the magnets 506a and 506b respectively form magnetic fields that are configured to cancel each other out (e.g., partially or completely) in the vicinity of the extraction slit 510 resulting in a magnetic field in the PEF cavity 502 that falls off rapidly away from the magnets to a low magnetic field region 512 away from the magnets. The magnetic field therefore comprises strong regions (e.g., the regions indicated by magnetic field lines) where a plasma, which may diffuse into the low magnetic field region 512, is generated. From the low magnetic field region 512 the plasma may diffuse out of the extraction aperture 510 into the beamline.

Figure 6A:
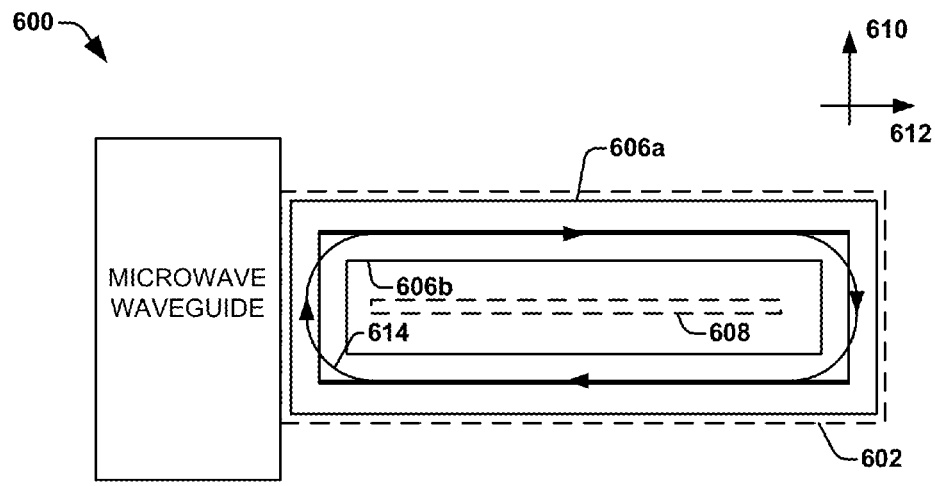
FIG. 6a illustrates a top view of a microwave PEF having a cavity, a first elongated magnet on the outside of a cavity wall and a second elongated magnet on the outside of a second cavity wall.

In addition to the circular motion of electrons about the field lines and the motion of the electrons along the field lines, discussed above, the magnetic field gradient results in a relatively slow electron motion known as grad-B drift. Referring to FIG. 5, the B-grad drift is perpendicular to the plane of the figure. FIG. 6a illustrates an embodiment wherein magnets 506a and 506b shown in the cross sectional view of FIG. 5 may comprise two "racetrack" rings of magnets, 606a and 606b. FIG. 6a further illustrates how the magnets may be arranged in a racetrack configuration so that this grad-B drift results in electron motion in a closed path 614, down one side of the PEF cavity 602, around the end and up the other side of the cavity 602.

Figure 6B:
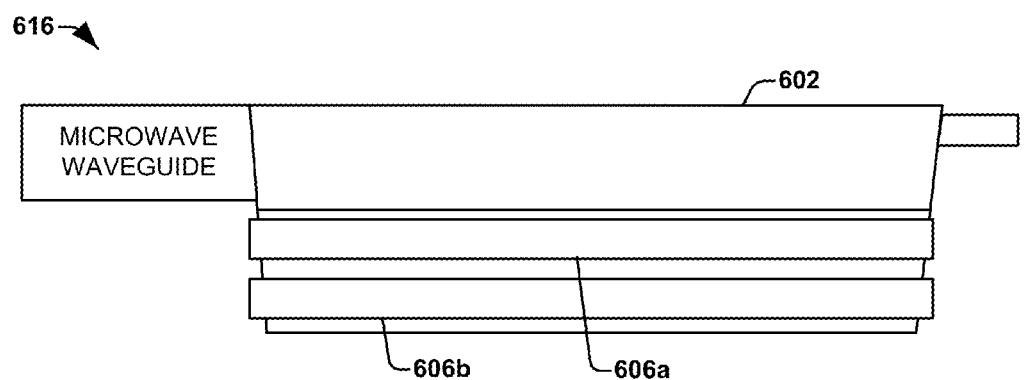
FIG. 6b illustrates a side view of a microwave PEF having a cavity, a first elongated magnet on the outside of a cavity wall, and second elongated magnet on the outside of a second cavity wall.

More particularly, FIG. 6a illustrates a top view of microwave PEF 600 having a PEF cavity 602 encompassed by a first elongated magnet 606a and a second elongated magnet 606b and FIG. 6b illustrates the configuration in side view. As shown in FIG. 6a, the first and second elongated magnets, 606a and 606b, run along a length of the PEF cavity 602 (e.g., along a length that spans the length of the elongated extraction slit 608). In one embodiment, the first and second elongated magnets 606a and 606b comprise two rows of elongated or "racetrack" shaped magnets, wherein each magnet wraps around the perimeter of the PEF cavity (i.e., runs down one side of the PEF cavity, wraps around end, goes up other side of the PEF, and wraps around the other end). In one embodiment, the two magnets 606a and 606b may each comprise stacks of magnets that are collectively formed into the shape of racetrack magnets. The resulting closed path 614 for grad-B drift electron motion is illustrated in FIG. 6a. This closed path results 614 in more uniform distribution of accelerated electrons, and therefore of ionization, along direction 512. In addition, efficiency is improved as drift motion path does not intersect walls of the cavity.

The elongated racetrack shaped magnets 606a and 606b form a magnetic field within the PEF cavity that is compact in the direction of propagation of an ion beam (direction 610), but that can be scaled to the width of the ion beam (direction 612). For example, in one embodiment elongated racetrack shaped magnets 606a and 606b having a first length can be used to generate a magnetic field that provides an electron flood evenly for a ribbon beam used to implant a 200 mm wafer, while in an alternative embodiment elongated racetrack shaped magnets 606a and 606b having a length longer than the first length can be used to generate a magnetic field that provides an electron flood evenly for a ribbon beam used to implant a 300 mm wafer.

Figure 7A:
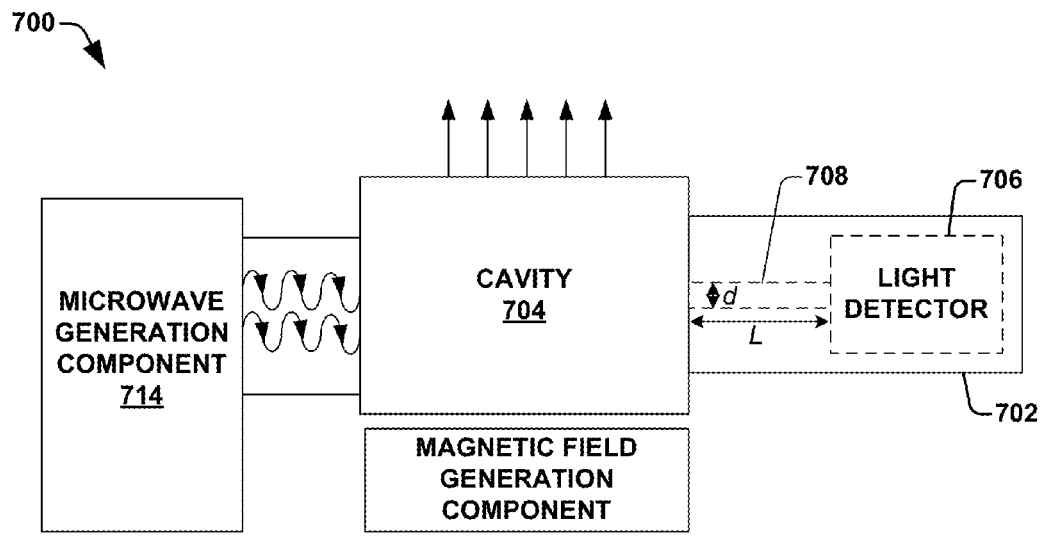
FIGS. 7a-7b illustrate various embodiments of a microwave PEF system having a plasma detection component configured to confirm that a plasma of the desired characteristics is present in the cavity.

As shown in FIG. 7a, in order to ensure that the PEF is operating properly, a microwave PEF system 700 may comprise a plasma detection component 702 employed to confirm that a plasma of the desired characteristics is present in the cavity 704. In one embodiment, the plasma detection component 702 may comprise a light detector 706 configured to detect light emitted by a plasma present in the cavity 704. The light detector 706 may be mounted at one end of a metal tube 708, with the other end of the tube inserted into one of the cavity walls. In one embodiment, if the tube's inner diameter d is small compared to the microwave wavelength (e.g. less than one tenth the wavelength) and small compared to the length of the tube L (e.g. less than one tenth the length), negligible microwave radiation will propagate through the tube 708 and microwave radiation will not interfere with the light detector 706.

Figure 7B:
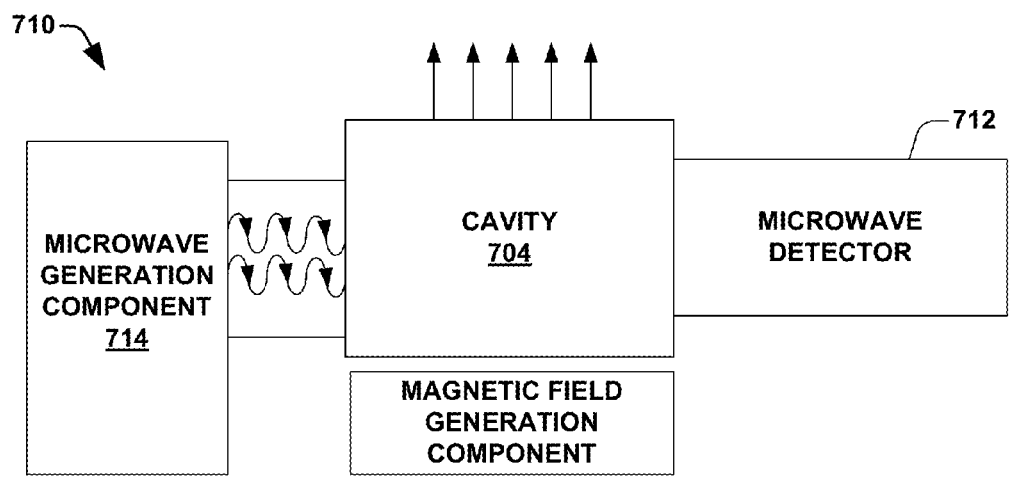

In an alternative embodiment, illustrated in FIG. 7b, a microwave PEF system 710 may have a plasma detection component comprising a microwave field detector 712 configured to detect the microwave field strength in the cavity at a position very close to an end of the cavity, which is spatially opposite the microwave input end of the cavity. If the microwave generation component 714 is providing microwave power to the cavity 704, but no plasma is present in the cavity 704, the microwave fields strength will build up to a relatively high value, producing a relatively high output from the detector 712. However, if a plasma is present in the cavity 704, it will load the cavity, greatly reducing the microwave field strength in the cavity and therefore the output of the detector 712.

Figure 8:
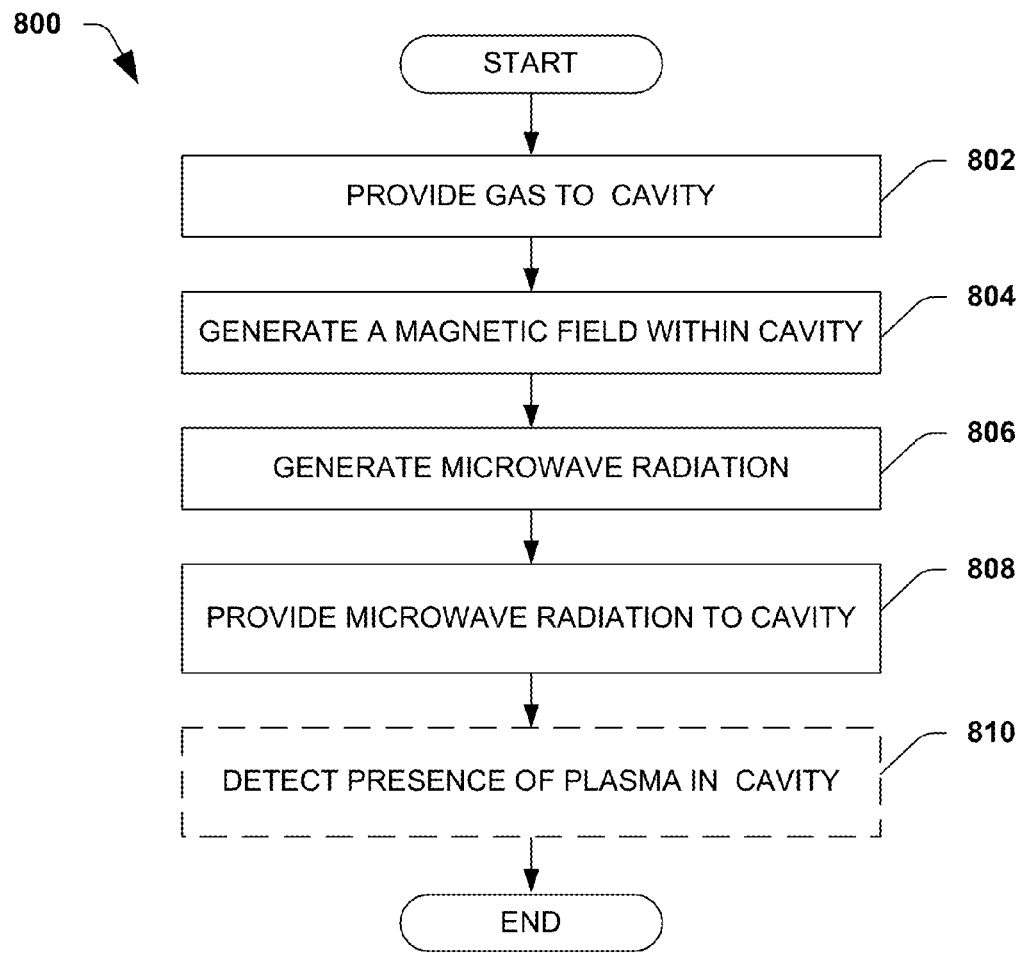
FIG. 8 illustrates a flow diagram of an exemplary method that may be used to form a plasma electron flood using microwave radiation.

FIG. 8 illustrates a flow diagram of an exemplary method 800 that may be used to form a plasma electron flood using microwave radiation. The method comprises exciting electrons, confined to ECR heating zones, using microwave radiation and allowing the plasma to diffuse from the ECR heating zones to a beamline via an extraction aperture.

While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 802 a gas is introduced into a cavity. The gas may be introduced into a cavity having one or more extraction apertures in direct communication with an ion implantation system beamline via a valve that causes the cavity (e.g., PEF cavity) to fill with the gas (e.g., argon). The pressure in the cavity can typically be regulated with a mass flow controller or other pressure regulation device.

A magnetic field is generated within the cavity at 804. The magnetic field may be generated using one or more permanent magnets such as rare earth permanent magnets, for example. In one embodiment, the magnet field comprises a static magnetic field having a field strength gradient (e.g., non-linear gradient) across the cavity's interior. In such an embodiment, the magnetic field rapidly decays over the cavity resulting in a static magnetic field having a high magnetic field strength near the "bottom" of the cavity and a low magnetic field strength (e.g., a substantially zero magnetic field) near the extraction aperture at the "top" of the cavity.

At 806 microwave radiation is generated. In one embodiment the microwave radiation may be generated using a magnetron to have a microwave frequency that is substantially equal to an electron cyclotron frequency in a region of the cavity.

The microwave radiation is provided to the cavity at 808. The radiation may be provided to the cavity through use of a waveguide. In various embodiments, different shaped waveguides may be used to excite different mode microwaves. For example, a rectangular waveguide may be used to excite TE01 mode microwaves, while a circular waveguide may be used to excite TE11 mode microwaves. The microwave radiation may be transmitted into the cavity using impedance matching methods well known to those skilled in the art.

Providing the microwave radiation to the cavity will cause electrons to absorb the microwave radiation in regions where the local electron cyclotron frequency is substantially equal to the microwave frequency. Therefore, it will be appreciated that the magnetic field may be selected to comprise a static magnetic field that produces electron cyclotron resonance at a frequency substantially equal to that of the delivered microwave energy. Therefore, the magnetic field has a high field strength in areas of the PEF where a plasma is generated and a low field strength (e.g., no magnetic field) in other areas of the PEF cavity.

At 810 the presence of a plasma in the cavity may be detected to ensure that the method of forming a plasma electron flood is operating properly (e.g., to ensure that the method is producing a plasma of the desired characteristics in the cavity). In one embodiment (described above in more detail in FIG. 7a), the presence of the plasma may be determined by detecting light emitted by the plasma. In an alternative embodiment (described above in more detail in FIG. 7b), the presence of the plasma may be determined by detecting a microwave field strength associated with the microwave radiation in the cavity at a position very close to the end of the cavity opposite the input end, wherein the microwave field strength is larger if no plasma is present in the cavity than if a plasma is present in the cavity. It will be appreciated that step 810 may be performed at one or more locations throughout the method so as to monitor the presence and characteristics of a plasma within the cavity.

Although the invention has been shown and described with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A plasma electron flood system, comprising:
   a microwave generation component configured to generate microwave radiation;
   a cavity configured to function as both a microwave cavity, substantially resonant at a frequency of the microwave radiation, and as a plasma chamber, wherein the cavity has one or more apertures that allow transmission of microwaves from the microwave generation component to the cavity, one or more extraction apertures in direct contact with an ion implantation system beam line, and an input for a gas; and a magnetic field generation component comprising one or more permanent magnets arranged in proximity to the cavity and configured to generate a magnetic field that decays rapidly over the cavity from a region of high magnetic field strength to a region of low magnetic field strength in the vicinity of the extraction apertures, wherein the one or more permanent magnets comprise a racetrack shape, which wraps around a perimeter of the cavity as a continuous shape, and that generates the magnetic field configured to form an Electron Cyclotron Resonance (ECR) heating zone extending along a length of the cavity;

wherein the magnetic field results in an electron cyclotron frequency in a region of the cavity that is equal to or approximately equal to the microwave radiation frequency so that a plasma is generated to diffuse through the extraction apertures.

2. The system of claim 1, wherein the one or more permanent magnets are substantially symmetrically disposed in relation to the extraction apertures so that the magnetic field has a value of substantially zero near the location of the extraction apertures.

3. The system of claim 1, wherein the one or more permanent magnets are disposed along one or more lower walls of the cavity spatially opposed to the extraction apertures.

4. The system of claim 1, wherein the magnetic field comprises a single north magnetic pole cusp and a single south magnetic pole cusp extending along the perimeter of the cavity.

5. The system of claim 1, wherein the cavity comprises a substantially empty housing containing no components other than the gas and the microwave radiation.

6. The system of claim 1, wherein the cavity comprises a housing that does not contain refractory metals.

7. The system of claim 1, further comprising a plasma detection component configured to confirm the presence of a plasma by detection of light emitted from the plasma in the cavity or by detection of a microwave field strength in the cavity.

8. The system of claim 1, wherein the system comprises one or more elements of high permeability material configured to reduce the magnitude of the magnetic field outside of the cavity.

9. A method for generating a microwave plasma electron flood, comprising:

providing a gas to a cavity having one or more extraction apertures in direct communication with an ion implantation system beam line;

generating a magnetic field within the cavity using one or more racetrack shaped permanent magnets configured to wrap around a perimeter of the cavity as a continuous shape that is substantially symmetric in relation to the one or more extraction apertures, wherein the magnetic field decays rapidly over the cavity from a region having a strong magnetic field to a region having a minimal magnetic field in the vicinity of the one or more extraction apertures, and wherein the magnetic field is configured to form an ECR heating zone extending along a length of the one or more extraction apertures so that the magnetic field has a value of zero near the location of the one or more extraction apertures;

generating microwave radiation having a frequency substantially equal to an electron cyclotron frequency in a region of the cavity; and providing the microwave radiation to the cavity, wherein the cavity has a resonant frequency substantially equal to the frequency of the microwave radiation, and wherein the microwave radiation is absorbed by the gas to form a plasma configured to diffuse through the one or more extraction apertures.

10. The method of claim 9, wherein the cavity comprises a substantially empty housing containing no components other than the gas and the microwave radiation.

11. The method of claim 10, wherein the cavity comprises a housing that does not contain refractory metals.

12. The method of claim 11, further comprising:

detecting the presence of the plasma within the cavity by detecting light emitted from the plasma in the cavity or by detecting a microwave field strength in the cavity.

* * * * *